(12) United States Patent
Medrano et al.

(10) Patent No.: US 8,502,087 B2
(45) Date of Patent: Aug. 6, 2013

(54) FILLER PANEL FOR AIR FLOW MANAGEMENT

(75) Inventors: Roberto Medrano, Wylie, TX (US); Mahesh Mistry, Parsippany, NJ (US); Albert Pedoeem, West Orange, NJ (US); Larry Fox, Nanuet, NY (US); Paul V. Shannon, Parsippany, NJ (US); Jimmy O. Goodwin, Lucas, TX (US)

(73) Assignee: Fujitsu Limited, Kawasaki-shi (JP)

( * ) Notice: Subject to any disclaimer, the term of this patent is extended or adjusted under 35 U.S.C. 154(b) by 343 days.

(21) Appl. No.: 12/874,771

(22) Filed: Sep. 2, 2010

(65) Prior Publication Data

US 2011/0180315 A1 Jul. 28, 2011

Related U.S. Application Data

(60) Provisional application No. 61/297,361, filed on Jan. 22, 2010.

(51) Int. Cl.
*H05K 9/00* (2006.01)

(52) U.S. Cl.
USPC ............ 174/383; 361/692; 454/184; 174/382

(58) Field of Classification Search
USPC ................. 174/377, 382, 383; 361/816, 800, 361/679.51, 692; 454/184
See application file for complete search history.

(56) References Cited

U.S. PATENT DOCUMENTS

| | | | | |
|---|---|---|---|---|
| 5,952,616 A * | 9/1999 | Morrow | ......................... | 174/135 |
| 6,281,433 B1 * | 8/2001 | Decker et al. | .................. | 174/394 |
| 6,628,518 B2 * | 9/2003 | Behl et al. | ................ | 361/679.47 |
| 6,724,640 B1 * | 4/2004 | Cooper | ......................... | 361/800 |
| 7,646,592 B2 * | 1/2010 | McCormick et al. | ..... | 361/679.02 |
| 7,697,285 B2 * | 4/2010 | Donowho et al. | ............. | 361/690 |
| 7,826,215 B2 * | 11/2010 | Glover et al. | ............ | 361/679.49 |
| 7,843,683 B2 * | 11/2010 | Suffern et al. | ............ | 361/679.46 |
| 7,957,139 B2 * | 6/2011 | Davis et al. | .................... | 361/690 |
| 8,405,984 B2 * | 3/2013 | Donowho et al. | ............. | 361/692 |
| 2001/0018979 A1 * | 9/2001 | Dispenza et al. | ............. | 174/350 |
| 2003/0156385 A1 * | 8/2003 | Askeland et al. | ............. | 361/687 |
| 2005/0030712 A1 * | 2/2005 | Faneuf et al. | ................. | 361/687 |
| 2005/0157472 A1 * | 7/2005 | Malone et al. | ................. | 361/724 |

\* cited by examiner

*Primary Examiner* — Hung Ngo
(74) *Attorney, Agent, or Firm* — Baker Botts L.L.P.

(57) ABSTRACT

A filler panel for an electronics shelf is provided. The electronics shelf includes a plurality of slots each configured to receive an electronic device. The filler panel includes a nonconductive main body that includes a front wall, a back wall, a top wall, a bottom wall and a single side wall. The front wall, back wall, top wall and bottom wall are configured to fill a width of a slot of the electronics shelf. The side wall is configured to extend into a depth of the slot, The filler panel also includes an electromagnetic shielding portion comprising a conductive material that is coupled to the main body. The main body further includes one or more vents positioned in each of the top wall and the bottom wall, the vents configured to allow air flow though the main body.

10 Claims, 3 Drawing Sheets

FILLER PANEL FOR AIR FLOW MANAGEMENT

RELATED APPLICATION

This application claims the benefit of U.S. provisional application No. 61/297,361 entitled "Filler Panel for Air Flow Management" filed Jan. 22, 2010, the contents of which is hereby incorporated by reference in its entirety.

TECHNICAL FIELD

The present invention relates generally to filler panels for equipment shelves and, more particularly, to a filler panel for air flow management.

BACKGROUND

The infrastructure behind modern electronic systems increasingly requires deployment of multiple communication devices in systems that consolidate the various device components into racks or shelves, which may reduce the storage and operation space required by the owner of the infrastructure as well as easing the effort required for operation or maintenance. The devices stored in these racks or shelves may include communication network components such as amplifiers, switches, network management cards, network interface cards, or other devices. However, in many instances not all available space within the rack is in use at a given point in time.

Filler panels are devices used to fill the unused space in such a rack or shelf. These panels serve many uses, including electromagnetic shielding (to ensure proper operation of the system components) and aesthetic appearance of the rack as a whole. Filler panels are also used to maintain airflow, meet certification requirements (e.g., GR-63-CORE and GR-1089-CORE), and provide EMI/ESD functionality. As more electronic devices are implemented and operated in consolidated racks or shelves, manufacturers and suppliers of such racks face increasing challenges in maintaining performance levels required by end-users while reducing the manufacturing and operating costs.

Traditional filler panels have been made from metal or mostly metal and are often rectangular boxes. Such a design use a lot of material and are costly. Filler panels typically come in three shapes—rectangular box style, cover style, and blade style. The rectangular filler panels are typically of a four-walled construction. The cover style is just a cover that covers an opening of a shelf when a unit is not installed in the opening. The blade style is a combination of a cover and a single walled blade that guides the filler panel into the opening in the shelf. It covers the opening but uses a single walled blade to form the filler panel.

SUMMARY

In accordance with a particular embodiment of the present disclosure, a filler panel for an electronics shelf is provided. The electronics shelf includes a plurality of slots each configured to receive an electronic device. The filler panel includes a non-conductive main body that includes a front wall, a back wall, a top wall, a bottom wall and a single side wall. The front wall, back wall, top wall and bottom wall are configured to fill a width of a slot of the electronics shelf. The side wall is configured to extend into a depth of the slot, The filler panel also includes an electromagnetic shielding portion comprising a conductive material that is coupled to the main body. The main body further includes one or more vents positioned in each of the top wall and the bottom wall, the vents configured to allow air flow though the main body.

In accordance with a particular embodiment of the present disclosure, a method for installing a filler panel in an electronics shelf is provided. The electronics shelf includes a plurality of slots each configured to receive an electronic device. The method includes inserting a filler panel in a slot of the electronics shelf. The filler panel includes a non-conductive main body that includes a front wall, a back wall, a top wall, a bottom wall and a single side wall. The front wall, back wall, top wall and bottom wall are configured to fill a width of a slot of the electronics shelf. The side wall is configured to extend into a depth of the slot, The filler panel also includes an electromagnetic shielding portion comprising a conductive material that is coupled to the main body. The main body further includes one or more vents positioned in each of the top wall and the bottom wall, the vents configured to allow air flow though the main body. In the method, the filler panel is inserted next to one of: a) a wall of the electronics shelf, b) an electronic device positioned in an adjacent slot of the electronics shelf, or c) a second filler panel positioned in an adjacent slot of the electronics shelf. The side wall of the filler panel and the wall of the electronics shelf, the electronic device, or the second filler panel thereby form an air flow channel between the vents.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION

Figure 1:
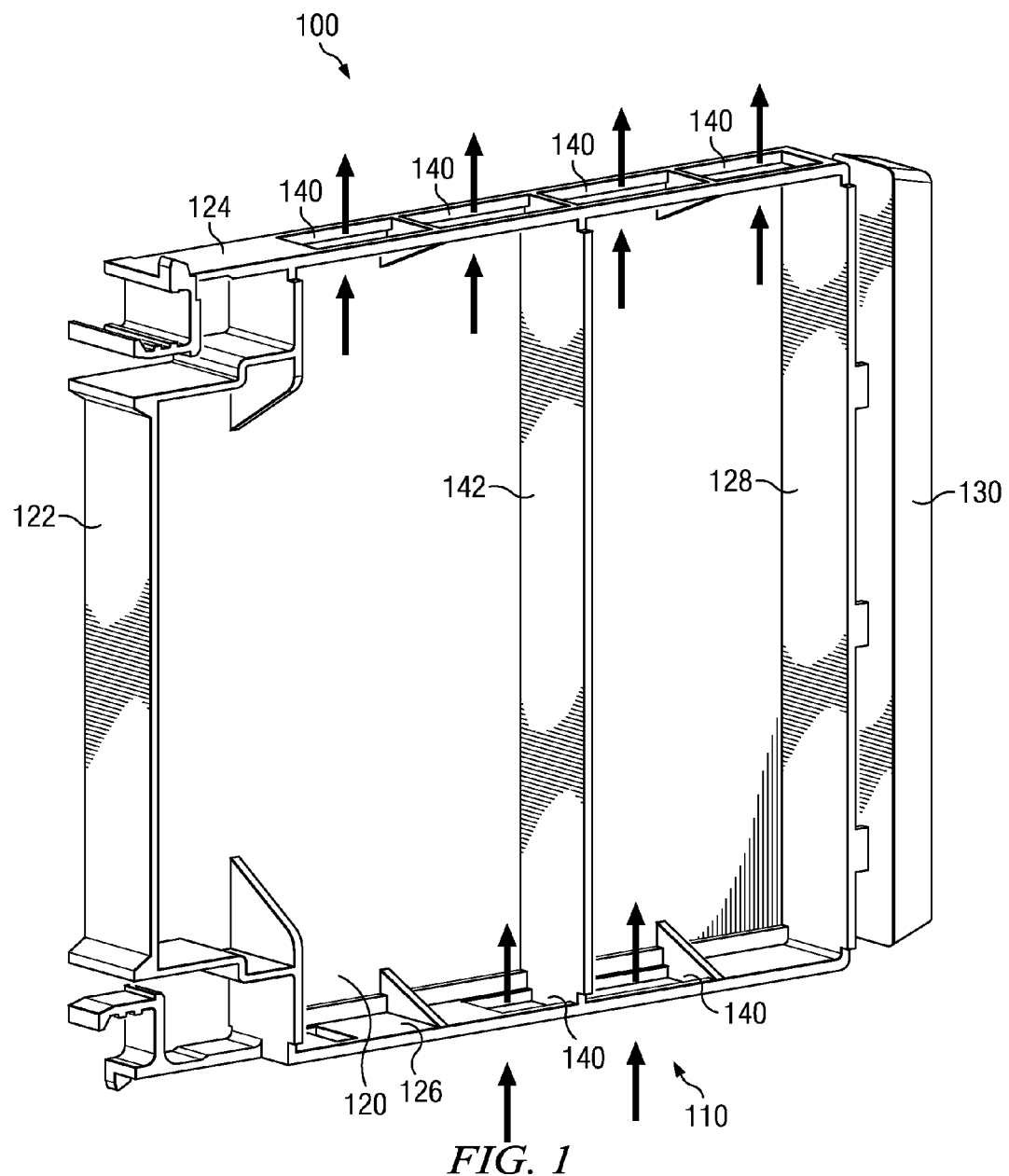
FIG. 1 illustrates a filler panel that may be used in a shelf that supports one or more electronic devices, in accordance with one embodiment of the present disclosure.

The present description relates to a new filler panel design for use in electronic device shelves, racks, cabinets and the like (generally referred to herein as "shelves"). Such a filler panel may be used to fill unused portions of the shelf, such as slots or bays, that do not have an associated electronic device installed. For the purposes of this disclosure, an electronic device may include any device or component configured for use in an electronics system, whether optical, mechanical, electrical, or otherwise. For example, an electronic device may be an optical amplifier card, a network storage device, a network interface card, multiplexer, a dispersion compensation module, or other device or component used in an electronics system and configured to be stored, maintained, and/or operated within a storage shelf, rack or cabinet. Such a shelf, rack or cabinet may be of standard size that accepts modular components, or may be custom-built and sized for a particular purpose. An electronic device may also include any electronic device or component configured for storage and/or operation in a shelf, rack or cabinet system, such as a computer server that houses server blades or other circuit boards in a shelf. The figures discussed herein disclose a filler panel for use in a telecommunications node; however, this should not be seen to limit the scope of the present disclosure. For instance, the filler panel disclosed herein may be applicable to many other environments, such as the storage and operation of computer servers, RF/Microwave equipment, or other devices requiring the use of electromagnetic shielding and blockage of open space within a storage shelf, rack or cabinet.

Although the terms "electronics" shelf and "electronic" device are used, it should be understood that in certain embodiments an electronic device (as that term is used herein) may be a passive component that does not actually include any electronics. As an example only, a shelf of an optical communications node may include passive dispersion compensation modules and other modules that do not include electronics. Such modules are included within the scope of the term "electronic device" as used herein.

Due to the close proximity of multiple electronic devices within the shelf, the aggregate electromagnetic fields produced by the electronic devices, which may be significant, may leak from the shelf. Thus, filler panels may be composed of materials that provide for electromagnetic shielding in order to prevent this leakage. There are two primary, related difficulties in creating filler panels with the requisite level of electromagnetic shielding. The most difficult of these is cost. Various known materials may provide acceptable levels of electromagnetic shielding. For instance, metals and conductive polymers, such as plastics impregnated with conductive fibers (e.g., steel), may be used for filler panels. While conductive polymers offer a less expensive alternative to using metallic or other conductive materials for manufacture of filler panels, these materials remain expensive. Additionally, the material properties of this relatively new class of materials remains poorly understood in comparison to traditional conductive materials (e.g., metals) or traditional, nonconductive plastics.

The second, related difficulty is aesthetics. The presence of the conductive material within a conductive polymer may make it difficult or impossible to provide a customized or matchable color or design to a specific end-user. The properties of traditional metallic conductors, whether used alone or as a fiber within the conductive polymer, increase the variability of coloring the filler panel. As a result, the aesthetic appeal of filler panels from different batches, or obtained at different times, may be undesirable in the eyes of the end-user. A solution to both difficulties is to manufacture only a portion of filler panel from a conductive material (when necessary for electromagnetic shielding), while using less expensive materials that may be more readily customizable for the remainder.

FIG. 1 illustrates a filler panel 100 that may be used in a shelf that supports one or more electronic devices, such as communication equipment. In some embodiments, the shelf may be used in optical networking equipment, such as in the Fujitsu Flashwave 9500 series platform. As mentioned above, filler panel(s) 100 may be used when all of the slots, bays or the other openings (generally referred to herein as "slots") within the shelf is not currently taken by electronic devices, such as optical line cards, amplifier cards, controller cards, and the like. For instance, the manufacturer of the shelf may provide expansion slots within the shelf so that the end-user may later expand its use of the shelf without needing to purchase an additional shelf. Filler panel 100 is an innovative modular design that uses color-matched non-conductive plastic and a small portion of conductive material (when necessary) that can be used to meet thermal and FCC emissions requirements while reducing the cost of the panel 100.

Filler panel 100 includes a main body 110 that may be made of a non-conductive plastic and a electromagnetic shielding portion 130 that is used to provide electromagnetic shielding. The main body 110 is formed to generally fill the area of the electronics shelf in which it is inserted and may be made of any suitable type of plastic or other suitable material. For example, in one embodiment, main body 110 is made of a blend of polystyrene and acrylonitrile-butadiene-styrene (ABS). In another embodiment, main body 110 may made of Cycoloy. In particular embodiments, main body 110 is UL94-V0 fire rated. Main body 110 may be formed by injection molding or any other suitable process. Main body 110 has a side wall 120, a front wall 122, a top wall 124, a bottom wall 126, and a back wall 128. The front wall 122 and back wall 128 may have a width that is similar to the width of the slot in which the filler panel 100 is to be inserted. The side wall 120 may have a depth that is similar the depth of the slot in which the filler panel 100 is to be inserted (minus the depth of electromagnetic shielding portion 130). The lack of a second side wall may provide for an open, less expensive design.

Electromagnetic shielding portion 130 may be a conductive plastic (such as a polycarbonate/ABS base with embedded nickel-coated carbon fiber, as one example), but could also be any other type of conductive material, such as metal. Electromagnetic shielding portion 130 may be formed by injection molding or any other suitable process. Electromagnetic shielding portion 130 may be configured in certain embodiments to interface with or generally conform to an electronic interface intended to be coupled with an electronic device, such as an electronics card, inserted into the slot of the shelf. In the illustrated embodiment, the electromagnetic shielding is needed at the back of the shelf and thus electromagnetic shielding portion 130 is positioned at the back end of the card (the end that is inserted first into the shelf) and coupled to back wall 128. However, the electromagnetic shielding portion 130 could also be located at the front end of the card and reconfigured accordingly.

Filler panel 100 also includes one or more vents 140 formed in each of top wall 124 and bottom wall 126. These vents 140 allow for air circulation through the filler panel 100 when inserted in a shelf. The air circulation may either be from the top to the bottom or the bottom to the top (although the air flow is often from the bottom to the top because heat rises). Vents 140 may be sized to allow an appropriate amount of air flow given a certain type of shelf and given the use of and components in that shelf (for example, certain configurations may be tested and then adjusted in size if the air flow is not appropriate). In some embodiments, vents 140 may be sized such that the air flow approximates the air flow over an electronic device (such as a card) that is designed to be inserted in the bay of the shelf which filler panel 100 is occupying. Filler panel 100 may also include one or more ribs 142 formed on side wall 120. Ribs 142 may be used to strengthen side wall 120 (the compensate for the lack of an opposing wall). Ribs 142 may also be used to direct air flow across the filler panel 100.

In short, filler panel 100 reduces cost by using a standard non-conductive plastic to form the main body of the panel and by eliminating and wall. The use of such plastic allows for ease of manufacture, while also allowing easy color-matching to the shelf and while maintaining air flow thermal requirements (as further discussed in FIG. 3). Furthermore, a electromagnetic shielding portion 130 can be used in applications requiring ESD and EMI conformance. Finally, stiffing ribs enforce form and maintain air flow requirements.

Figure 2:
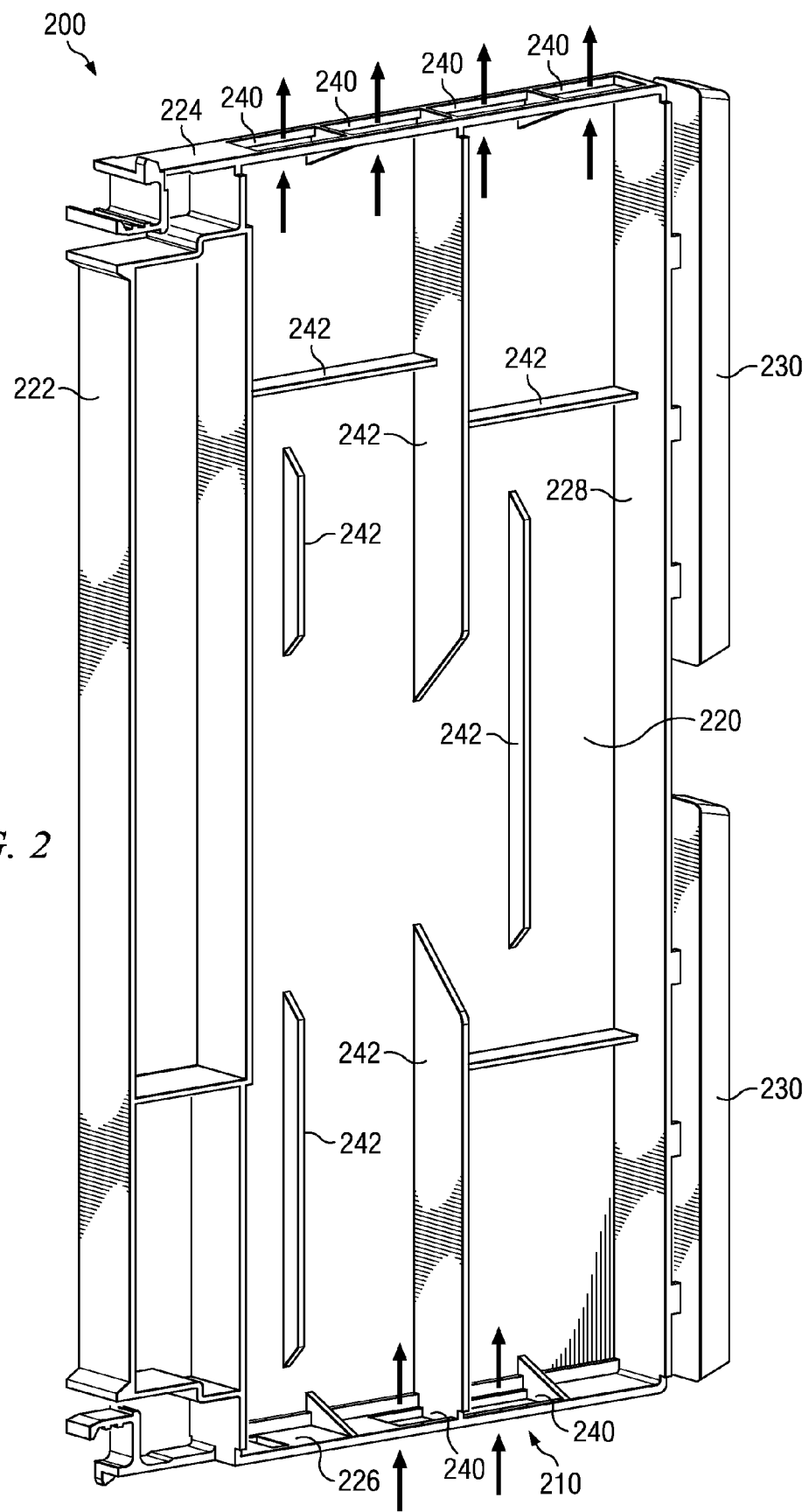
FIG. 2 illustrates another filler panel that may be used in a shelf that supports one or more electronic devices, in accordance with another embodiment of the present disclosure.

FIG. 2 illustrates similar features of a filler panel 200 configured for a larger expansion bay in a shelf. Like filler panel 100, filler panel 200 may have a main body 210 that includes a side wall 220, a front wall 222, a top wall 224, a bottom wall 226, and a back wall 228, as well as associated vents 240 and ribs 242. Like filler panel 100, filler panel 200 also includes conductive portions 230 (two or more conductive portions 230 may be present to accommodate the larger bay size and/or the existence of multiple electrical interfaces/card slots in the bay).

Figure 3:
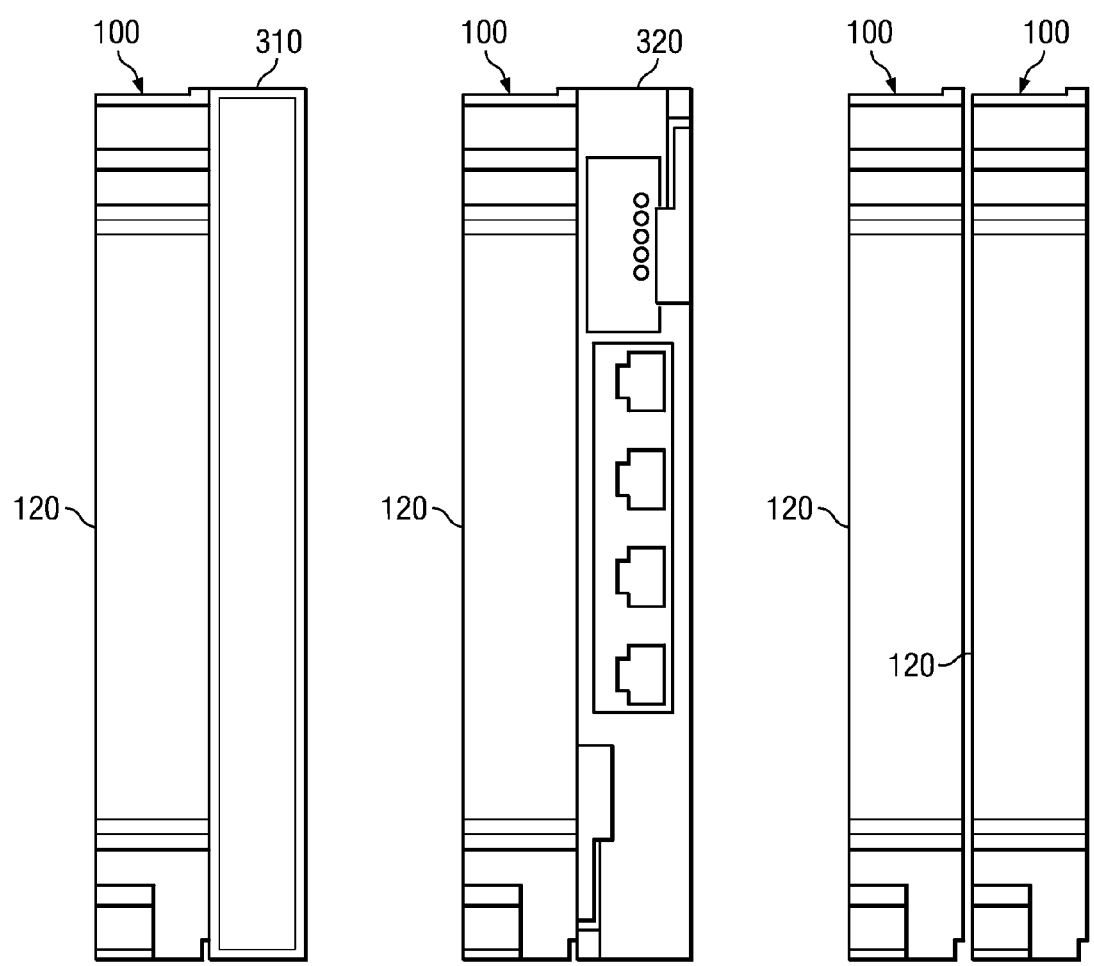
FIG. 3 illustrates different installation configurations for a filler panel, in accordance with particular embodiments of the present disclosure.

FIG. 3 illustrates three different installation configuration for a filler panel 100 (which would also apply to filler panel 200). As illustrated, airflow is maintained by close proximity of the filler panel 100 to the side wall 310 of the shelf, to an electronic device in an adjacent slot of the shelf, such as a service unit 320, or to a filler panel 100 in an adjacent slot of the shelf. More specifically, these adjacent devices substitute for the "missing" side wall opposite the side wall 120 of the filler panel and form the required air flow channel. Thus, an open walled filler panel design can be used, while still maintaining proper air flow.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure.

What is claimed:

1. A filler panel for an electronics shelf, the electronics shelf comprising a plurality of slots each configured to receive an electronic device, the filler panel comprising:
    a non-conductive main body, the main body comprising a front wall, a back wall, a top wall, a bottom wall and a single side wall, the front wall, back wall, top wall and bottom wall configured to fill a width of a slot of the electronics shelf and the side wall configured to extend into a depth of the slot when the slot does not contain an electronic device; and
    an electromagnetic shielding portion comprising a conductive material and coupled to the main body;
    the main body further comprising one or more vents positioned in each of the top wall and the bottom wall, the vents configured to allow air flow though the main body.

2. The filler panel of claim 1, wherein the main body comprises a non-conductive plastic.

3. The filler panel of claim 1, wherein the conductive material comprises a conductive plastic.

4. The filler panel of claim 1, wherein the conductive material comprises a metal.

5. The filler panel of claim 1, wherein the electromagnetic shielding portion is coupled to the back wall of the main body.

6. A method for installing a filler panel in an electronics shelf, the electronics shelf comprising a plurality of slots each configured to receive an electronic device, the method comprising:
    inserting a filler panel in a slot of the electronics shelf that does not contain an electronic device, the filler panel comprising:
        a non-conductive main body, the main body comprising a front wall, a back wall, a top wall, a bottom wall and a single side wall, the front wall, back wall, top wall and bottom wall configured to fill a width of a slot of the electronics shelf and the side wall configured to extend into a depth of the slot; and
        an electromagnetic shielding portion comprising a conductive material and coupled to the main body;
        the main body further comprising one or more vents positioned in each of the top wall and the bottom wall, the vents configured to allow air flow though the main body; and
    wherein the filler panel is inserted next to one of: a) a wall of the electronics shelf, b) an electronic device positioned in an adjacent slot of the electronics shelf, or c) a second filler panel positioned in an adjacent slot of the electronics shelf, where the side wall of the filler panel and the wall of the electronics shelf, the electronic device, or the second filler panel form an air flow channel between the vents.

7. The method of claim 6, wherein the main body comprises a non-conductive plastic.

8. The method of claim 6, wherein the conductive material comprises a conductive plastic.

9. The method of claim 6, wherein the conductive material comprises a metal.

10. The method of claim 6, wherein the electromagnetic shielding portion is coupled to the back wall of the main body.

\* \* \* \* \*